(12) United States Patent
Chen

(10) Patent No.: US 11,652,170 B2
(45) Date of Patent: May 16, 2023

(54) TRENCH FIELD EFFECT TRANSISTOR STRUCTURE FREE FROM CONTACT HOLE

(71) Applicant: CHINA RESOURCES MICROELECTRONICS (CHONGQING) CO., LTD, ChongQing (CN)

(72) Inventor: Qian Chen, ChongQing (CN)

(73) Assignee: CHINA RESOURCES MICROELECTRONICS (CHONGQING) CO., LTD., ChongQing (CN)

( * ) Notice: Subject to any disclaimer, the term of this patent is extended or adjusted under 35 U.S.C. 154(b) by 0 days.

(21) Appl. No.: 17/600,113

(22) PCT Filed: Dec. 31, 2019

(86) PCT No.: PCT/CN2019/130508
§ 371 (c)(1),
(2) Date: Sep. 30, 2021

(87) PCT Pub. No.: WO2021/114437
PCT Pub. Date: Jun. 17, 2021

(65) Prior Publication Data
US 2022/0302308 A1    Sep. 22, 2022

(30) Foreign Application Priority Data

Dec. 13, 2019    (CN) .......................... 201911283322.0

(51) Int. Cl.
*H01L 29/78* (2006.01)
*H01L 21/266* (2006.01)
(Continued)

(52) U.S. Cl.
CPC ........ *H01L 29/7827* (2013.01); *H01L 21/266* (2013.01); *H01L 29/401* (2013.01); *H01L 29/4236* (2013.01); *H01L 29/66666* (2013.01)

(58) Field of Classification Search
CPC . H01L 29/7827; H01L 21/266; H01L 29/401; H01L 29/4236; H01L 29/66666;
(Continued)

(56) References Cited

U.S. PATENT DOCUMENTS

| 5,034,785 A | 7/1991 | Blanchard |
| 5,776,812 A | 7/1998 | Takahashi et al. |
| 6,057,558 A | 5/2000 | Yamamoto et al. |

FOREIGN PATENT DOCUMENTS

| CN | 1823422 A | 8/2006 |
| CN | 103151309 B  * | 3/2015 |

(Continued)

*Primary Examiner* — Mohammad M Hoque

(57) ABSTRACT

The present disclosure provides a trench field effect transistor and a manufacturing method. The manufacturing method includes: providing a semiconductor substrate, forming an epitaxial layer, a first trench, a second trench, a first gate dielectric layer, a first gate structure, a second gate dielectric layer, a second gate structure, and a body region, forming a source implantation mask, performing ion implantation based on the source implantation mask to form a source, and forming a source electrode structure. Self-aligned source implantation is implemented by designing a source implantation mask, and a body region lead-out region is formed while forming a source, so that the source and the body region are directly led out. The present disclosure uses a self-alignment technique to further reduce a cell dimension, and enables equal-potential electrical lead-out of the source and the body region without providing a source contact hole.

5 Claims, 7 Drawing Sheets

(51) Int. Cl.
*H01L 29/40* (2006.01)
*H01L 29/423* (2006.01)
*H01L 29/66* (2006.01)

(58) Field of Classification Search
CPC ............ H01L 29/0696; H01L 29/0869; H01L 29/1095; H01L 29/7811; H01L 29/7813; H01L 29/66734; H01L 29/0684; H01L 29/0847; H01L 29/66712; H01L 29/0865; H01L 29/41725; H01L 29/66621; H01L 29/7802
USPC ....................................................... 257/330
See application file for complete search history.

(56) References Cited

FOREIGN PATENT DOCUMENTS

| | | | |
|---|---|---|---|
| CN | 105321992 A | | 2/2016 |
| JP | 2894820 B2 | * | 5/1999 |
| JP | 2017084839 A | * | 5/2017 |

* cited by examiner

TRENCH FIELD EFFECT TRANSISTOR STRUCTURE FREE FROM CONTACT HOLE

TECHNICAL FIELD

The present disclosure relates to the field of integrated circuit design and manufacturing technologies, and in particular, to a trench field effect transistor structure and a manufacturing method for the same.

BACKGROUND

Trench devices (for example, a square layout trench metal-oxide-semiconductor (MOS) field effect transistor) as important power devices have a wide range of applications and have a relatively low on-resistance, a relatively high switching speed, and good resistance to avalanche impact. Requirements of energy conservation and emission reduction and market competition further reduce the on-resistance of the device while ensuring that other performance parameters of the device remain unchanged. As is well known that, reducing a lateral spacing of cells of a trench device to increase a cell density is a quite effective method for reducing a source-drain on-resistance. However, limited by capabilities of a lithography machine and an etching machine, the lateral spacing of the cells cannot be continuously reduced. Conventionally, a certain space needs to be prepared to manufacture contact holes to electrically lead out a body region and a source of the device. For a square layout trench field effect transistor, a square layout is a closed-loop structure and the transistor has a higher channel density than a strip layout device and a lower Ron (on-resistance) than the strip layout device. However, with the development of trench field effect transistors, higher-density trenches are required to reduce an on-resistance, reduce device losses, and increase a switching speed. However, a conventional square layout requires a sufficient region for forming contact holes to electrically lead out an independent body region formed by a closed-loose structure and a source. As a cell dimension reduces, it is not enough to form a contact hole in the form of an opening to lead out the body region and the source, and it is difficult to achieve equal-potential lead-out of the body region and the source.

Therefore, it is necessary to provide a trench field effect transistor structure and a manufacturing method for the same to resolve the problems in the related art.

SUMMARY OF THE PRESENT DISCLOSURE

In view of the foregoing defects in the related art, an objective of the present disclosure is to provide a trench field effect transistor structure and a manufacturing method for the same, to resolve problems that it is difficult for a cell dimension to continue to be reduced, and a body region and a source are difficult to be effectively led out, and the like.

To achieve the objective and other related objectives, the present disclosure provides a manufacturing method for a trench field effect transistor structure, and the manufacturing method comprises the following steps:

providing a semiconductor substrate, and forming an epitaxial layer on the semiconductor substrate;

forming a plurality of parallel first trenches arranged at intervals and a plurality of parallel second trenches arranged at intervals in the epitaxial layer, where the first trenches and the second trenches are arranged to intersect each other to define a plurality of implantation regions based on the adjacent first trenches and second trenches;

forming a first gate dielectric layer on an inner wall of the first trench, and forming a first gate structure on the first gate dielectric layer so that the first gate structure is filled in the first trench; and forming a second gate dielectric layer on an inner wall of the second trench, and forming a second gate structure on the second gate dielectric layer so that the second gate structure is filled in the second trench;

performing ion implantation on the epitaxial layer to form a body region in the implantation region, where the body region abuts both the first trench and the second trench;

forming a source implantation mask on the epitaxial layer, where the source implantation mask includes a plurality of spaced implantation mask units, and the implantation mask unit covers a junction of the first trench and the second trench and extends to cover the implantation region around the junction, to form at least one shielding region on the body region;

performing ion implantation on the epitaxial layer based on the source implantation mask to form a source in the body region, where the shielding region forms a body region lead-out region; and forming, on the epitaxial layer, a source electrode structure in contact with both an upper surface of the source and an upper surface of the body region lead-out region, to electrically lead out the source and the body region.

The present disclosure further provides a trench field effect transistor structure. The trench field effect transistor structure is preferably obtained by using the manufacturing method for a trench field effect transistor structure according to the present disclosure. Certainly, the trench field effect transistor structure may also be manufactured by using another method. The trench field effect transistor structure includes:

a semiconductor substrate;

an epitaxial layer, formed on the semiconductor substrate, where a plurality of parallel first trenches arranged at intervals and a plurality of parallel second trenches arranged at intervals are formed in the epitaxial layer, the first trenches and the second trenches are arranged to intersect each other to form a plurality of junctions, and the adjacent first trenches and second trenches define a plurality of implantation regions;

a first gate dielectric layer and a second gate dielectric layer, respectively formed on an inner wall of the first trench and an inner wall of the second trench;

a first gate and a second gate, respectively formed on a surface of the first gate dielectric layer and a surface of the second gate dielectric layer, where the first gate is filled in the first trench, and the second gate is filled in the second trench;

a body region, formed in the implantation region, where the body region abuts both the first trench and the second trench, the body region includes at least one body region lead-out region, and the body region lead-out region abuts the junction around the body region;

a source, formed in the body region, where the source abuts the body region lead-out region, and an upper surface of the source is flush with an upper surface of the body region lead-out region; and a source electrode structure, where the source electrode structure is in contact with both the upper surface of the source and the upper surface of the body region lead-out region, to electrically lead out the source and the body region.

As described above, according to the trench field effect transistor structure and the manufacturing method for the same consistent with the present disclosure, self-aligned source implantation is implemented by designing a source implantation mask, and a body region lead-out region is formed while forming a source, so that the source and the body region are directly led out. The present disclosure uses a self-alignment technique to further reduce a cell dimension, and enables equal-potential electrical lead-out of the source and the body region without providing a source contact hole. For a closed-loop structure of a square trench field effect transistor, the present disclosure resolves problems of reduction of a cell dimension and lead-out of a body region from a process and a layout, thereby preventing a pre-mature breakdown of the device.

DETAILED DESCRIPTION OF THE PREFERRED EMBODIMENTS

The following describes implementations of the present disclosure by using specific embodiments. A person skilled in the art may easily understand other advantages and effects of the present disclosure from the content disclosed in this specification. The present disclosure may further be implemented or applied through other different specific implementations. Various details in this specification may also be modified or changed based on different viewpoints and applications without departing from the spirit of the present disclosure.

Embodiment I

Figure 1:
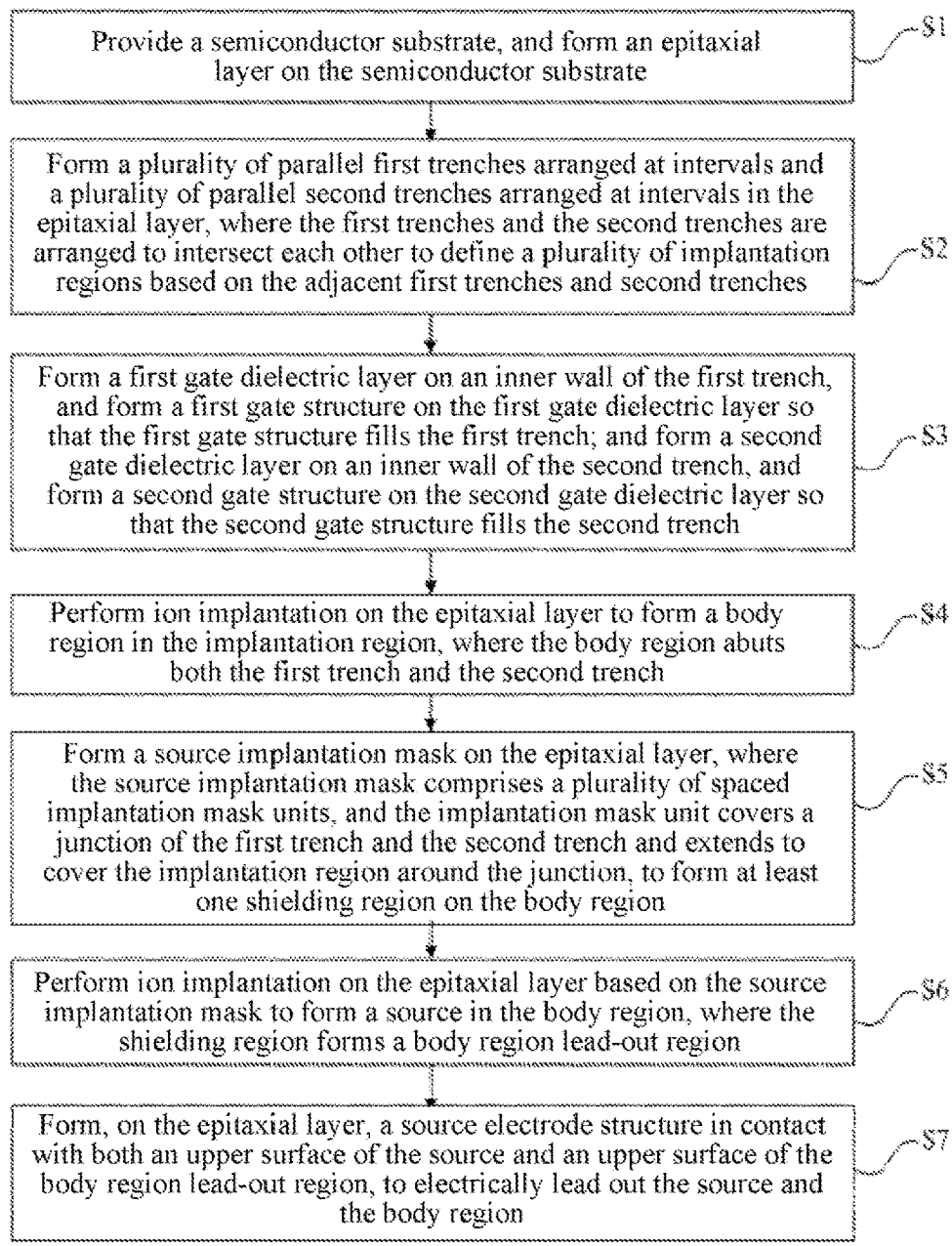
FIG. 1 is a process flowchart of trench field effect transistor manufacturing according to the present disclosure.

As shown in FIG. 1, the present disclosure provides a manufacturing method for a trench field effect transistor structure. The method includes the following steps:

providing a semiconductor substrate, and forming an epitaxial layer on the semiconductor substrate;

forming a plurality of parallel first trenches arranged at intervals and a plurality of parallel second trenches arranged at intervals in the epitaxial layer, where the first trenches and the second trenches are arranged to intersect each other to define a plurality of implantation regions based on the adjacent first trenches and second trenches;

forming a first gate dielectric layer on an inner wall of the first trench, and forming a first gate structure on the first gate dielectric layer so that the first gate structure is filled in the first trench; and forming a second gate dielectric layer on an inner wall of the second trench, and forming a second gate structure on the second gate dielectric layer so that the second gate structure is filled in the second trench;

performing ion implantation on the epitaxial layer to form a body region in the implantation region, where the body region abuts both the first trench and the second trench;

forming a source implantation mask on the epitaxial layer, where the source implantation mask includes a plurality of spaced implantation mask units, and the implantation mask unit covers a junction of the first trench and the second trench and extends to cover the implantation region around the junction, to form at least one shielding region on the body region;

performing ion implantation on the epitaxial layer based on the source implantation mask to form a source in the body region, where the shielding region forms a body region lead-out region, and an upper surface of the source is flush with an upper surface of the body region lead-out region; and forming, on the epitaxial layer, a source electrode structure in contact with both an upper surface of the source and an upper surface of the body region lead-out region, to electrically lead out the source and the body region.

The manufacturing method for a semiconductor test structure in the present disclosure will be described below in detail with reference to accompanying drawings.

Figure 2:
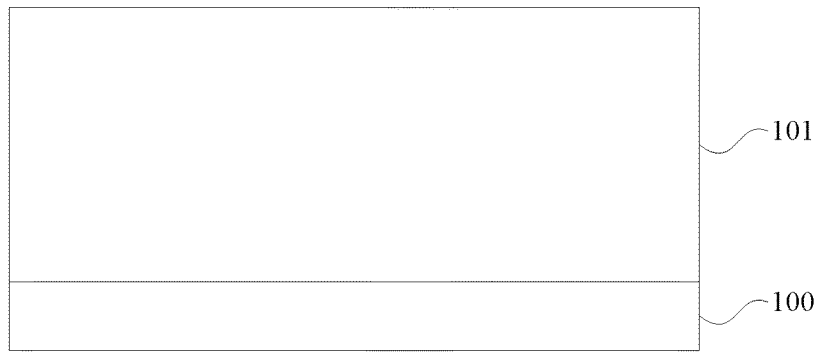
FIG. 2 is a schematic structural diagram of forming an epitaxial layer during trench field effect transistor manufacturing according to the present disclosure.

As shown in S1 in FIG. 1 and in FIG. 2, a semiconductor substrate 100 is provided, and an epitaxial layer 101 is formed on the semiconductor substrate 100.

Specifically, the semiconductor substrate 100 may be a substrate of a first doping type. The first doping type (that is, a first conductivity type) may be P-type doping or N-type doping. The semiconductor substrate 100 may be formed by implanting ions of the first doping type (P type or N type) into an intrinsic semiconductor substrate by using an ion implantation process, and a specific type is set according to requirement of an actual device. In this embodiment, the semiconductor substrate 100 is an N-type doped substrate. In addition, in an example, the semiconductor substrate 100 may be a heavily-doped substrate. For example, the concentration of ions of the first doping type doped in the semiconductor substrate 100 may be greater than or equal to 1×1019/cm3. It should be noted that the semiconductor substrate 100 may be a silicon substrate, a silicon germanium substrate, a silicon carbide substrate, or the like. In this example, the semiconductor substrate 100 is an N++-type doped silicon substrate, for example, may be 0.001-0.003 ohm*cm. The first doping type and a second doping type (that is, a second conductivity type) mentioned subsequently are opposite doping (conductivity) types. When a semiconductor of the first doping type (the first conductivity type) is an N-type semiconductor, and a semiconductor of the second doping type (the second conductivity type) is a P-type semiconductor, a trench metal-oxide-semiconductor field-effect transistor (MOSFET) device in the present disclosure is an N-type device; conversely, the trench MOSFET device in the present disclosure is a P-type device.

In addition, in an example, a doping type of the epitaxial layer 101 is the same as that of the semiconductor substrate 100. In an optional example, the doping concentration of the epitaxial layer 101 is lower than that of the semiconductor substrate 100. An intrinsic epitaxial layer may be first formed on an upper surface of the semiconductor substrate 100 of the first doping type by using an epitaxial process, and ions of the first doping type are then implanted into the intrinsic epitaxial layer by using an ion implantation process, to form the epitaxial layer 101 of the first doping type. In another example, the epitaxial layer 101 of the first doping type may also be directly formed on epitaxy of the upper surface of the semiconductor substrate 100 of the first doping type by using an epitaxial process. In this example, the epitaxial layer 101 is an N-type monocrystalline silicon epitaxial layer.

Figure 3:
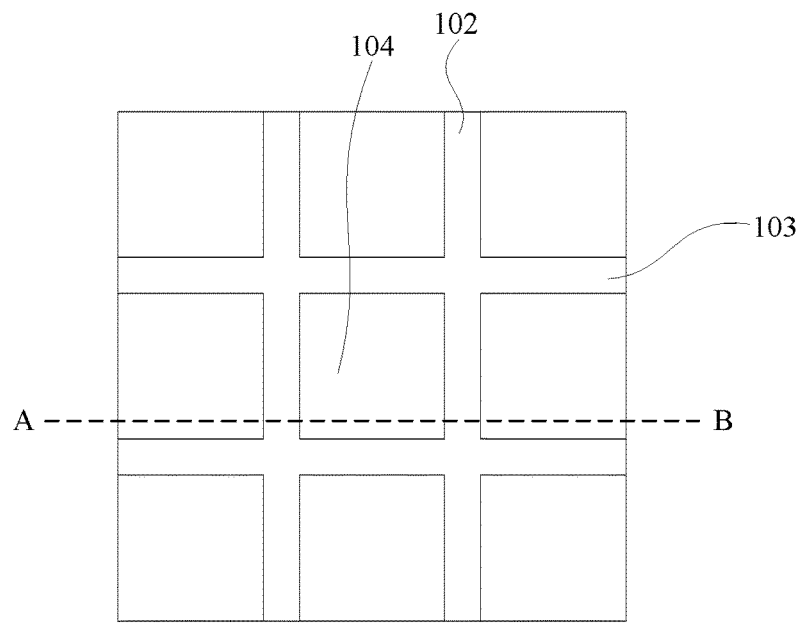
FIG. 3 is a schematic top view of forming a first trench and a second trench during trench field effect transistor manufacturing according to the present disclosure.
Figure 4:
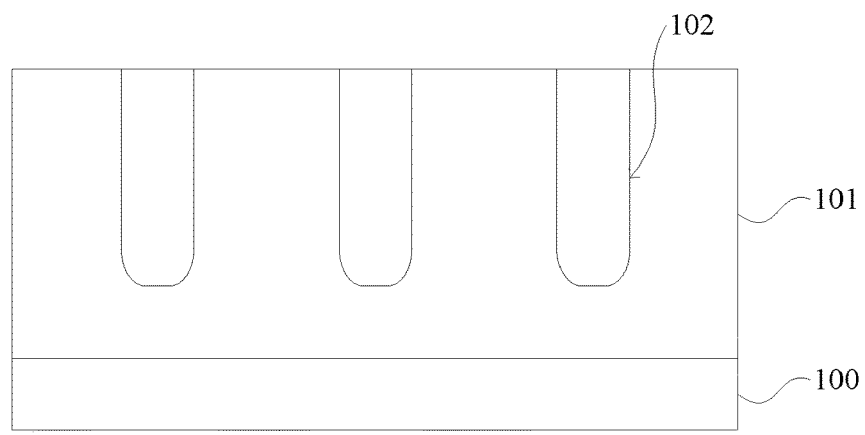
FIG. 4 is a schematic diagram of a cross-section along an A-B line in FIG. 3.

As shown in S2 in FIG. 1 and in FIG. 3 and FIG. 4, a plurality of parallel first trenches 102 arranged at intervals and a plurality of parallel second trenches 103 arranged at intervals are formed in the epitaxial layer 101. The first trenches 102 and the second trenches 103 are arranged to intersect each other to define a plurality of implantation regions 104 based on the adjacent first trenches 102 and the second trenches 103. The first trench 102 and the second trench 103 may be implemented by using photolithography and etching processes.

FIG. 3 and FIG. 4 show a specific optional example of the present disclosure. FIG. 4 shows a cross-section along an A-B line in FIG. 3. The figure only illustrates relevant structures and position relationships of the relevant structures. Quantities of the structures should not be excessively limited. The first trench 102 is perpendicular to the second trench 103. A shape of the formed implantation region 104 is a rectangle. Two adjacent first trenches 102 and two adjacent second trenches 103 define an implantation region 104 with a quadrilateral structure, thus forming a square layout trench field effect transistor (for example, a square layout trench MOS field effect transistor), so that gates can be arranged and formed in the first trenches 102 and the second trenches 103 to manufacture a device structure, increase a channel density of the device, and reduce an on-resistance of the device. In an optional example, a spacing between the first trenches 102 is equal to a spacing between the second trenches 103, so that a plurality of square implantation regions 104 of an equal size can be obtained. Certainly, the shape of the implantation region 104 may alternatively be a rectangle or another shape obtained based on the first trenches 102 and the second trenches 103, is not limited thereto, and may be set according to an actual requirement.

Figure 5:
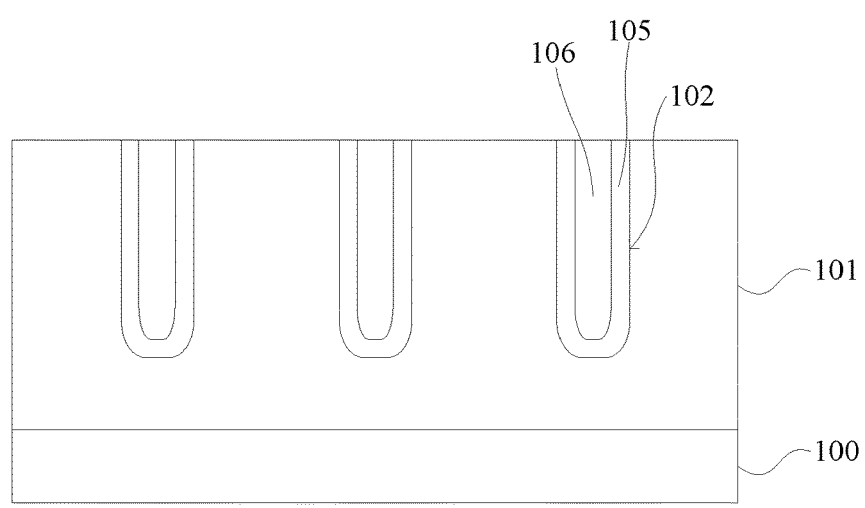
FIG. 5 is a diagram of forming a first gate dielectric layer and a first gate structure during trench field effect transistor manufacturing according to the present disclosure.

As shown in S3 in FIG. 1 and in FIG. 5, a first gate dielectric layer 105 is formed on an inner wall of the first trench 102, and a first gate structure 106 is formed on the first gate dielectric layer 105. The first gate structure 106 is filled in the first trench 102. A second gate dielectric layer is formed on an inner wall of the second trench 103, and a second gate structure (not shown in the figure) is formed on the second gate dielectric layer. The second gate structure is filled in the second trench 103.

Specifically, in an example, the continuous first gate dielectric layer 105 is formed on the bottom and side walls of the first trench 102. An upper surface of the first gate dielectric layer 105 is flush with an upper surface of the epitaxial layer 101. A forming process may be to form a continuous first gate dielectric material layer on the bottom and the side walls of the first trench 102 and the epitaxial layer 101 around the first trench 102, and remove the first gate dielectric material layer on the epitaxial layer 101 to obtain the first gate dielectric layer 105 on the bottom and the side walls of the first trench 102. Optionally, the first gate dielectric material layer on the epitaxial layer 101 may be alternatively reserved first for subsequent processes jointly. The first gate dielectric material layer is used as the first gate dielectric layer 105, where the first gate dielectric layer 105 may be formed by using a thermal oxidation process or a chemical vapor deposition process. Similarly, a forming process and a structure of the second gate dielectric layer are similar to those of the first gate dielectric layer 105, and details are not repeated herein again. In addition, in an example, after the first trench 102 and the second trench 103 are formed, the first gate dielectric layer 105 and the second gate dielectric layer are formed based on the same process.

In an example, before the first gate dielectric layer 105 and the second gate dielectric layer are formed, the method further includes a step of: forming a sacrificial oxide layer on surfaces of sides and the bottoms of the first trench 102 and the second trench 103, and removing the sacrificial oxide layer to restore the inner walls of the first trench 102 and the second trench 103 and to restore damage in an etching process. Optionally, the sacrificial layer may be formed by using a thermal oxidation process. In an example, the sacrificial oxide layer may be removed by using a wet etching process.

In addition, a surface of the first gate dielectric layer 105 formed on the inner wall of the first trench 102 forms a gate trench. The first gate structure 106 is filled in the gate trench. The first gate structure 106 may be used as a gate of the device, and a material of the first gate structure 106 includes, but is not limited to, polysilicon. In this case, the first gate structure 106 is lower than a surface of the epitaxial layer 101. The gate trench further leaves a space for forming an insulating layer on the upper surface of the first gate structure 106 to finally form a trench field effect transistor structure. In another example, the first gate structure 106 may be not directly used as the gate of the device, and further needs to be etched subsequently to obtain the gate of the device, so as to facilitate the protection of the gate in a subsequent process. Similarly, a forming process and a structure of the second gate structure are similar to those of the first gate structure 106. In addition, in an example, after the first gate dielectric layer 105 and the second gate dielectric layer are formed, the first gate structure 106 and the second gate structure are formed based on the same process.

Figure 6:
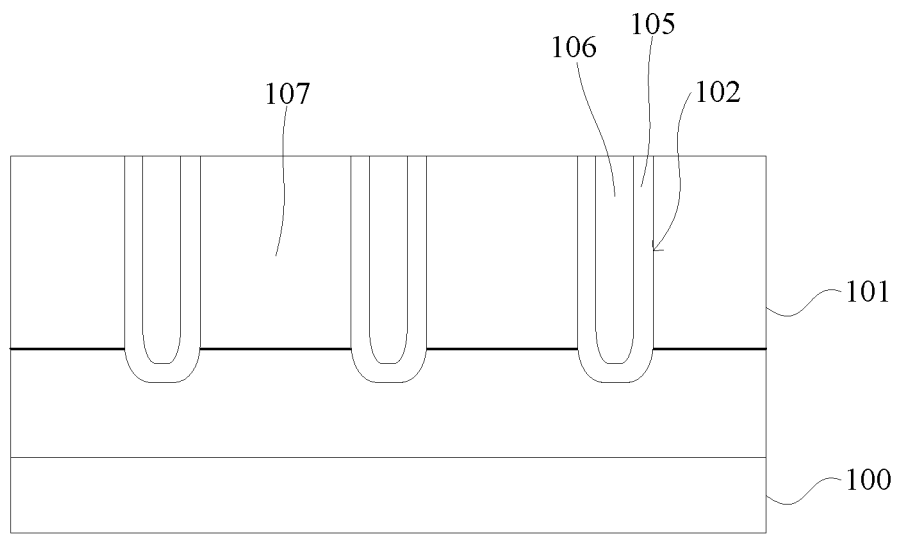
FIG. 6 is a schematic diagram of forming a body region during trench field effect transistor manufacturing according to the present disclosure.

As shown in S4 in FIG. 1 and in FIG. 6, ion implantation is performed on the epitaxial layer 101 to form a body region 107 in the implantation region 104. The body region 107 is located between adjacent trenches. The body region 107 abuts both the first trench 102 and the second trench 103. In an example, a doping type of the body region 107 is opposite to doping types of the epitaxial layer 101 and the semiconductor substrate 100. The body region 107 has the second doping type. In this example, the body region 107 is selected to be P-type lightly doped. In addition, in an example, after the first gate structure 106 and the second gate structure are formed, ion implantation may be directly performed to form the body region 107, so that a mask layer does not need to be manufactured, and implanted ions can enter the first gate structure 106. In addition, the first gate dielectric layer 105 may be alternatively formed on the epitaxial layer on which implantation needs to be performed to form the body region 107. In this case, when the first gate structure 106 is formed, a deposited material layer is also formed above the epitaxial layer and formed on a surface of the first gate dielectric layer 105 in a corresponding part. In this case, when ion implantation is performed to form the body region 107, a material layer that is used to form the first gate structure 106 and that is on the top of the epitaxial layer in this part may be removed and the first gate dielectric layer 105 in the corresponding part may be exposed. In this case, ion implantation is performed. Part of the first gate dielectric layer herein can protect the epitaxial layer during ion implantation. In another preferred example, in a subsequent process after ion implantation is performed to form the body region 107 and a subsequent source 109, the first gate structure 106 and the second gate structure further need to be etched to form the device gate. In an optional embodiment, a lower surface of the body region 107 is higher than the bottoms of the first trench 102 and the second trench 103. There is a height difference between the bottom of the body region 107 and the bottoms of the two types of trenches. In addition, in an example, a step of performing high temperature annealing after ion implantation is further included to form the body region 107. In an example, an implantation dose may be adjusted according to requirements of performance parameters such as a threshold voltage and a breakdown voltage of the device.

Figure 7:
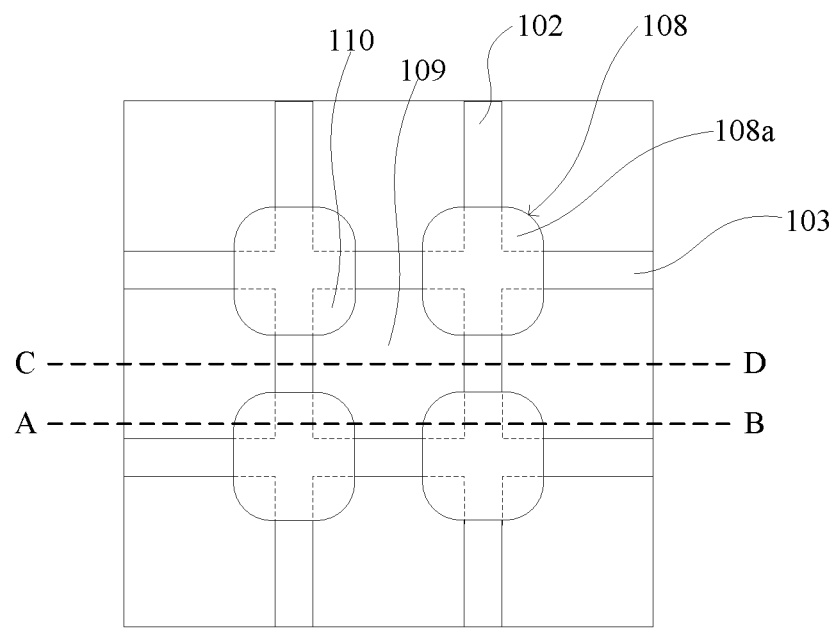
FIG. 7 is a schematic top view of forming a source implantation mask during trench field effect transistor manufacturing according to the present disclosure.
Figure 8:
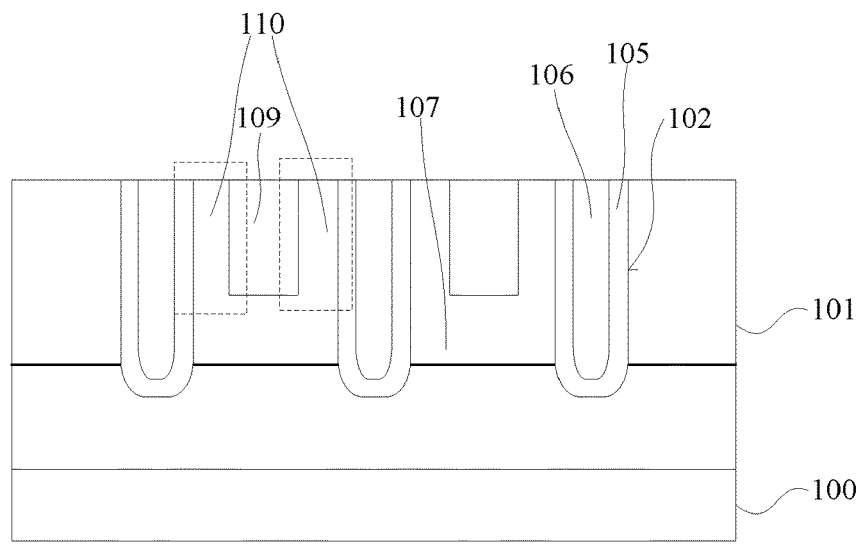
FIG. 8 is a schematic diagram of a cross-section along an A-B line in FIG. 7.
Figure 9:
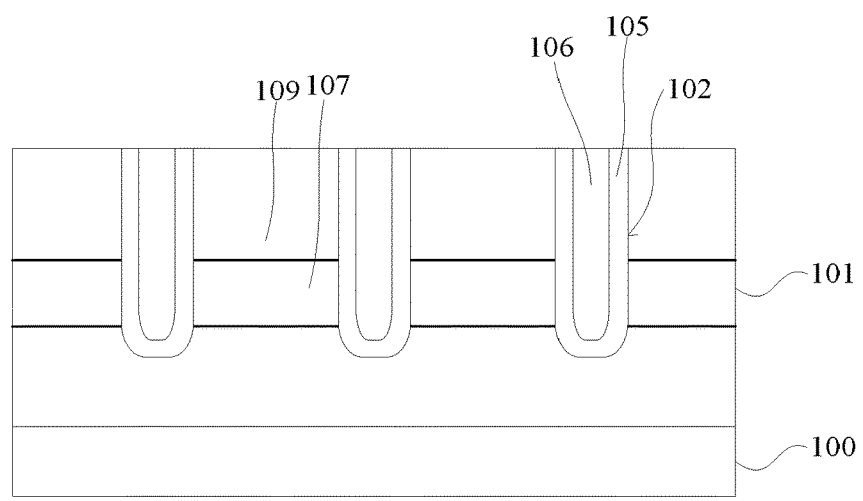
FIG. 9 is a schematic diagram of a cross-section along a C-D line in FIG. 7.

As shown in S5 in FIG. 1 and FIG. 7, after the body region 107 is formed, a source implantation mask 108 is formed on the epitaxial layer 101. The source implantation mask 108 includes a plurality of implantation mask units 108a, and there is a spacing between adjacent implantation mask units 108a. The implantation mask unit 108a covers the junction of the first trench 102 and the second trench 103 and extends to cover the implantation region 104 around the junction to form at least one shielding region in the body region 107. In an example, the implantation mask unit 108a extends to cover the four adjacent implantation regions 104 around the implantation mask unit. The shielding region is a part of the body region 107 covered by the implantation mask unit 108a. Therefore, under the cover of the source implantation mask, the body region of the part is not subjected to ion implantation and still serves as a part of the body region. A characteristic dimension of the source implantation mask may be relatively large, which is conducive to the implementation of the process. In an example, the characteristic dimension (CD) of the source implantation mask 108 is between 0.3-0.5 microns, which may be 0.35 microns, 0.4 microns, or 0.45 microns. In addition, the characteristic dimension may be implemented by using an I line machine.

Next, as shown in S6 in FIG. 1 and FIG. 7 to FIG. 9, ion implantation is performed on the epitaxial layer 101 based on the source implantation mask 108 to form the source 109 in the body region 107. The shielding region forms a body region lead-out region 110, so that an upper surface of the source 109 is flush with an upper surface of the body region lead-out region 110. In this case, the upper surface of the source 109 refers to an upper surface of the body region 107 after implantation, that is, the upper surface of the epitaxial layer 101. In this case, the upper surface of the body region lead-out region 110 refers to an upper surface of a part covered by the source implantation mask 108 in which source 109 implantation is not performed, that is, the upper surface of the body region 107 and the upper surface of the epitaxial layer 101. Based on the above process, in the present disclosure, ion implantation for the source 109 is performed under the cover of the source implantation mask 108 to form a lead-out region of the body region 107 while forming the source 109, that is, define the body region lead-out region 110 at the same time, so that the source 109 and the body region 107 are electrically led out without manufacturing contact holes for the source 109. In a conventional device structure, a distance (overlap) between two layers between a source contact hole and a device trench needs to be strictly controlled. As a device characteristic dimension (pitch) reduces, asymmetries of overlaps between different source contact holes and the device trench lead to a problem of VT (threshold voltage) or ID (drain leakage). The present disclosure uses a self-aligned process and thus does not have the above problem. As long as a source electrode structure (metal) is in good contact with an active region, the overlap between the device trench and the source is symmetrical. In the solution of the present disclosure, the upper surface of the source 109 is flush with the upper surface of the body region 107, which can implement equal-potential electrical lead-out of the source 109 and the body region 107, is conducive to preventing the device from a pre-mature breakdown, and preventing a problem that a breakdown is further caused because charges are easy to accumulate during a work process of a closed-loop structure in a case of body region floating (the body region is not led out at an equal-potential of the source, which is easy to produce a potential difference during working and may further cause an ID abnormality). Through the foregoing solution of the present disclosure, a cell dimension can continue to be reduced, a pitch size is further reduced to be less than 0.9 um, and a trench density of the device is further increased, thereby reducing an on-resistance, reducing device losses, and improving a switching response speed. In addition, as the cell dimension reduces, equal-potential lead-out is performed for the source 109 and the body region 107 without manufacturing contact holes, and the device can be prevented from a pre-mature breakdown, thereby obtaining stable electrical properties of the device, and facilitating implementation and mass production in process manufacturing.

In an example, the implantation mask unit 108a covers the junction of the first trench 102 and the second trench 103 and extends to cover four implantation regions 104 around the junction, to form four body region lead-out regions 110 in each body region 107. That is, the part of the body region 107 covered by the implantation mask unit 108a forms the body region lead-out region 110. Under the action of the implantation mask unit 108a, the four body region lead-out regions 110 are spaced apart, are respectively located at four corners of the implantation region 104, and are formed around the source 109. Preferably, the four body region lead-out regions 110 are symmetrically distributed in the body region 107, thereby helping to improve electrical uniformity.

In an example, the first trench 102 is perpendicular to the second trench 103. A shape of the formed implantation region 104 includes a rectangle. A shape of the implantation mask unit 108a includes a rectangle, and areas of intersection regions of the implantation regions 104 intersecting the implantation mask unit 108a are the same. The shape of the implantation region 104 is selected to be a square, and the implantation mask unit 108a is also selected to be a square, so that the formed body region lead-out region 110 is also a square and is symmetrically distributed in the body region 107, thereby obtaining the source 109 with a symmetrical structure, which is beneficial to improve the electrical uniformity.

Figure 10:
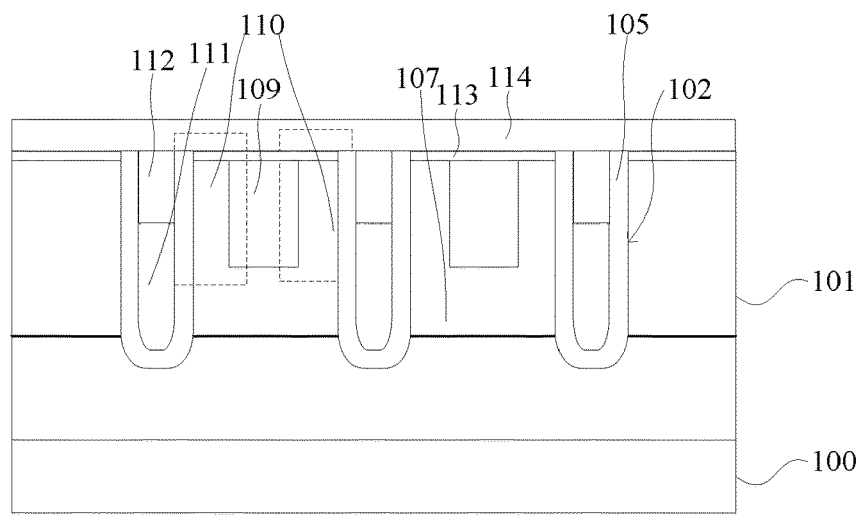
FIG. 10 is a schematic diagram of a cross-section along an A-B line with a formed source electrode structure during trench field effect transistor manufacturing according to the present disclosure.
Figure 11:
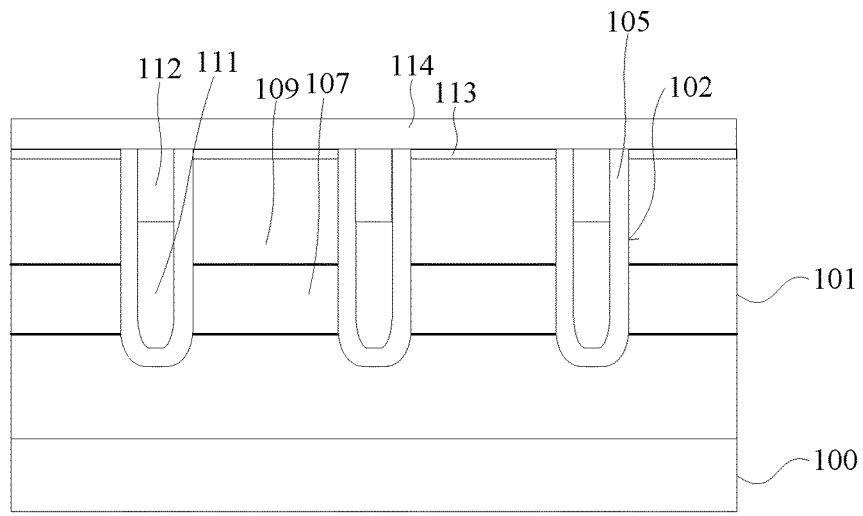
FIG. 11 is a schematic diagram of a cross-section along a C-D line with a formed source electrode structure during trench field effect transistor manufacturing according to the present disclosure.

As shown in FIG. 10 and FIG. 11, in an example, upper surfaces of the first gate structure 106, the second gate structure, the first gate dielectric layer 105, and the second gate dielectric layer that are formed in the foregoing steps are flush, where the first gate dielectric layer 105 may only be formed in the first trench 102 and the second gate dielectric layer may only be formed in the second trench 103, or the first gate dielectric layer 105 and the second gate dielectric layer may be respectively formed in the first trench 102 and the second trench 103 and further extend onto the surface of the epitaxial layer 101.

After the source 109 is formed, the example further includes a step of: back-etching the first gate structure 106 to obtain a first gate 111, and forming a first insulating layer 112 on the first gate 111 so that the first insulating layer 112 is filled in the first trench 102. Similarly, the second gate structure is back-etched to obtain a second gate, and a second insulating layer is formed on the second gate so that the second insulating layer is filled in the second trench 103. Preferably, the upper surfaces of the first insulating layer 112, the second insulating layer, the body region 107, and the source 109 are flush. The source electrode structure 114 further extends onto upper surfaces of the first insulating layer 112 and the second insulating layer. In an example, upper surfaces of the formed first gate 111 and the second gate are higher than a lower surface of the source 109. In addition, a high-density plasma process (HDP) may be used to deposit a high-density plasma oxide layer, that is, to form a first insulating material layer and a second insulating material layer, and then perform chemical-mechanical polishing (CMP) on the first insulating material layer and the second insulating material layer, that is, perform CMP on the deposited high-density plasma oxide layer to obtain the first insulating layer 112 and the second insulating layer. In an example, heights of the first insulating material layer and the second insulating material layer are higher than the upper surface of the epitaxial layer 101, that is, the first insulating material layer and the second insulating material layer protrude from the first trench 102 and the second trench 103. CMP is then performed on the first insulating material layer and the second insulating material layer to obtain the first insulating layer 112 and the second insulating layer, so that the quality of the formed insulating layer can be improved. In an example, back-etching depths of the first gate structure 106 and the second gate structure are between 2000 A and 3000 A, which can be understood as a distance between the upper surface of the first gate 111 and the upper surface of the epitaxial layer 101, and a distance between the upper surface of the second gate and the upper surface of the epitaxial layer 101 are between 2000 A and 3000 A, which may be 2500 A in this embodiment. Thicknesses of the deposited first insulating material layer and the second insulating material layer are between 3000 A and 4000 A. In this example, corresponding to the 2500 A etched away, a deposited HDP oxide layer may be 3000 A.

In an example, referring to FIG. 10 and FIG. 11, after the first insulating layer 112 and the second insulating layer are formed, the method further includes a step of: forming at least a metal silicide layer (silicide) on the source 109 on the upper surface of the source 109 and the upper surface of the body region lead-out region 110. In an example, metal silicide may be Ti-silicide, but it is not limited thereto. The source electrode structure 114 is formed on a surface of the metal silicide layer on the source 109. A forming process of the metal silicide may be to form metal titanium on at least the upper surface of the body region 107 and the upper surface of the source 109, and then perform rapid thermal processing (RTP) to form the metal silicide layer to reduce a contact resistance.

As shown in S7 in FIG. 1 and FIG. 10 and FIG. 11, a source electrode structure 114 in contact with both the upper surface of the source 109 and the upper surface of the body region lead-out region 110 is formed on the epitaxial layer 101, to electrically lead out the source 109 and the body region 107. A material of the source electrode structure 114 may be aluminum but is not limited thereto.

Figure 12:
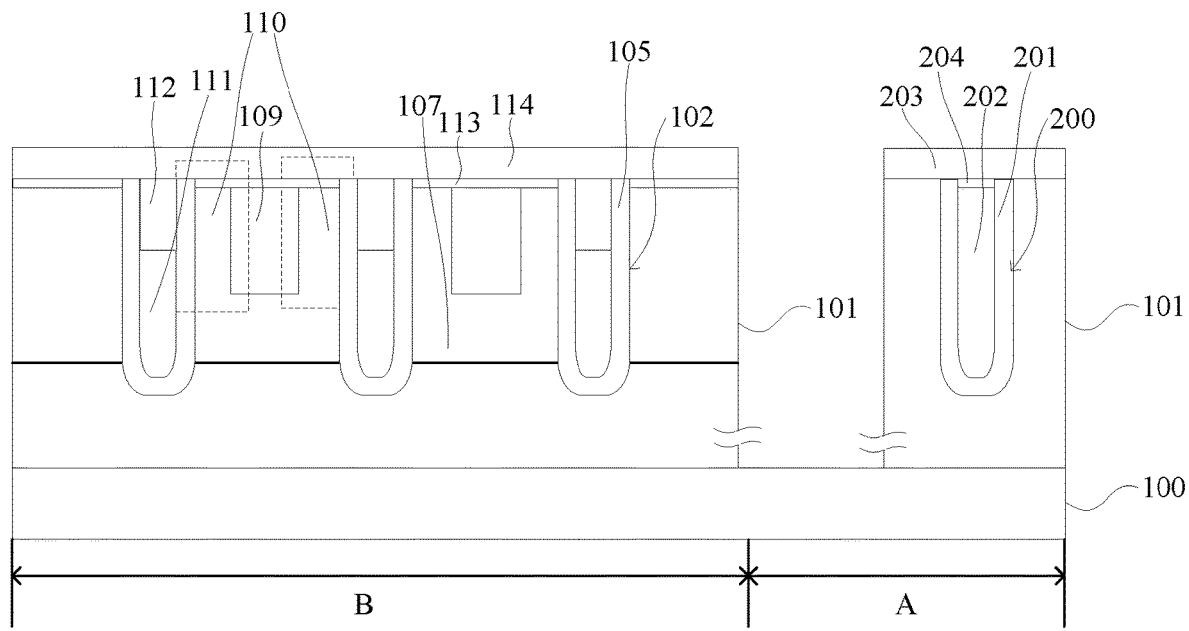
FIG. 12 is a schematic diagram of a cross-section along an A-B line with a formed lead-out gate structure during trench field effect transistor manufacturing according to the present disclosure.
Figure 13:
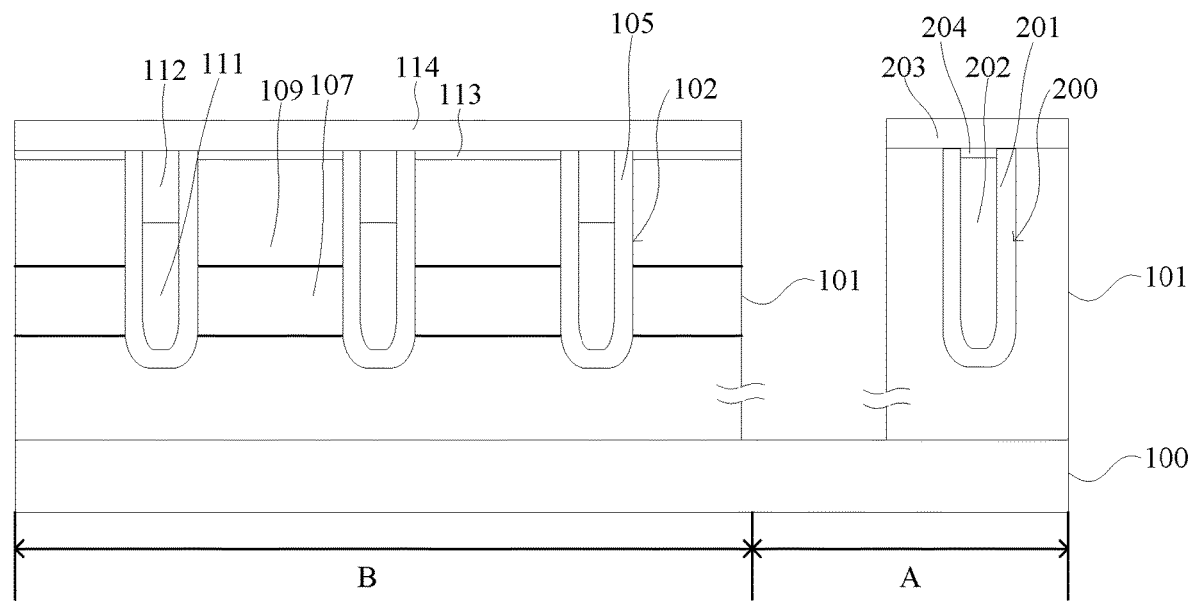
FIG. 13 is a schematic diagram of a cross-section along an A-B line with a formed lead-out gate structure during trench field effect transistor manufacturing according to the present disclosure.

As shown in FIG. 12 and FIG. 13, the manufacturing method for a trench field effect transistor structure further includes a step of manufacturing a lead-out gate structure. A device region B and a termination region A are defined in the epitaxial layer 101. In an example, the first trench 102 and the second trench 103 are formed in the device region B. A lead-out gate trench 200 is manufactured in the termination region A while forming the first trench 102 and the second trench 103. A lead-out gate dielectric layer 201 is formed on an inner wall of the lead-out gate trench 200, a lead-out gate 202 is formed on a surface of the lead-out gate dielectric layer 201, and a lead-out gate electrode structure 203 electrically connected to the lead-out gate 202 is further formed on the termination region A. The lead-out gate dielectric layer 201, the first gate dielectric layer 105, and the second gate dielectric layer are formed based on the same process. The lead-out gate 202, the first gate structure 106, and the second gate structure are formed based on the same process. In an example, when the first gate structure 106 and the second gate structure are etched to form the first gate 111 and the second gate, the lead-out gate 202 in the lead-out gate trench 200 is retained to be electrically connected to a lead-out gate electrode structure for electrical lead-out when the lead-out gate electrode structure is subsequently formed. In addition, the first gate 111 and the second gate may be led out to a gate pad by using a peripheral trench. In an example, the first gate 111 and the second gate are pulled out of the first trench and the second trench to an edge of a die, and a large trench is then used to string all trenches at the edge of the die into the gate pad. In an alternative example, the first gate and the second gate are electrically led out by using the lead-out gate structure in the termination region A.

In an example, the lead-out gate electrode structure 203 and the source electrode structure 114 are manufactured based on the same process, for example, may be etched after a monolithic metal material layer is formed. For example, a photomask may be used for etching, and the source electrode structure 114 and the lead-out gate electrode structure 203 are etched to insulate the two. In another optional example, after the lead-out gate 202 is formed, a step of manufacturing a metal silicide layer on lead-out gate 204 is further included. The lead-out gate electrode structure 203 is formed on a surface of the metal silicide layer on lead-out gate 204 to reduce a contact resistance. In an optional example, an upper surface of the lead-out gate 202 is flush with the upper surface of the source 109, and the lead-out gate electrode structure 204 is insulated from the source electrode structure 114, and both are manufactured based on the same process.

Embodiment II

As shown in FIG. 10 to FIG. 13, and with reference to FIG. 1 to FIG. 9, the present disclosure further provides a trench field effect transistor structure. The trench field effect transistor structure is preferably obtained by using a manufacturing method for a trench field effect transistor structure of embodiment I in the present disclosure. Certainly, the trench field effect transistor structure may also be manufactured by using another method. The trench field effect transistor structure includes: a semiconductor substrate 100, an epitaxial layer 101, first trenches 102 and second trenches 103 formed in the epitaxial layer 101, a first gate dielectric layer 105, a second gate dielectric layer (not shown in the figure), a first gate 111, a second gate (not shown in the figure), a body region 107, a source 109, and a source electrode structure 114.

The semiconductor substrate 100 may be a substrate of a first doping type. In this embodiment, the semiconductor substrate 100 is an N-type doped substrate. In addition, in an example, the semiconductor substrate 100 may be a heavily-doped substrate. For example, the concentration of ions of the first doping type doped in the semiconductor substrate 100 may be greater than or equal to $1\times10^{19}/cm^3$. It should be noted that the semiconductor substrate 100 may be a silicon substrate, a silicon germanium substrate, a silicon carbide substrate, or the like. In this example, the semiconductor substrate 100 is an N++-type doped silicon substrate, for example, may be 0.001-0.003 ohm*cm.

In addition, in an example, a doping type of the epitaxial layer 101 is consistent with a doping type of the semiconductor substrate 100. In an optional example, the doping concentration of the epitaxial layer 101 is lower than that of the semiconductor substrate 100. In this example, the epitaxial layer 101 is an N-type monocrystalline silicon epitaxial layer.

Specifically, a plurality of parallel first trenches 102 arranged at intervals and a plurality of parallel second trenches 103 arranged at intervals are formed in the epitaxial layer 101. The first trenches 102 and the second trenches 103 are arranged to intersect each other to form a plurality of junctions, and the adjacent first trenches 102 and the second trenches 103 define a plurality of implantation regions 104. In an example, the first trench 102 is perpendicular to the second trench 103. A shape of the formed implantation region 104 is a rectangle. Two adjacent first trenches 102 and two adjacent second trenches 103 define an implantation region 104 with a quadrilateral structure, thus forming a square layout trench field effect transistor (for example, a square layout trench MOS field effect transistor), so that gates can be arranged and formed in the first trenches 102 and the second trenches 103 to manufacture a device structure, increase a channel density of a device, and reduce an on-resistance of the device. In an optional example, a spacing between the first trenches 102 is equal to a spacing between the second trenches 103, so that a plurality of square implantation regions 104 of an equal size can be obtained. Certainly, the shape of the implantation region 104 may alternatively be a rectangle or another shape obtained based on the first trenches 102 and the second trenches 103, is not limited thereto, and may be set according to an actual requirement.

The first gate dielectric layer 105 is continuously formed on the bottom and side walls of the first trench 102. An upper surface of the first gate dielectric layer 105 is flush with an upper surface of the epitaxial layer 101. Alternatively, the first gate dielectric layer 105 may be continuously formed on the bottom and the side walls of the first trench 102 and the surface of the epitaxial layer 101 around the first trench 102. Similarly, a structure of the second gate dielectric layer is similar to a structure of the first gate dielectric layer 105, and details are not repeated herein again.

The first gate 111 is formed on a surface of the first gate dielectric layer 105. The first gate 111 is filled in the first trench 102, and an upper surface of the first gate 111 is lower than an upper surface of the epitaxial layer 101. A material of the first gate 111 includes, but is not limited to, polysilicon. In an example, a spacing between the upper surface of the first gate 111 and the upper surface of the epitaxial layer 101 is between 2000 A and 3000 A. In this example, the spacing may be 2500 A. Similarly, a structure of the second gate is similar to a structure of the first gate 111, and details are not described herein again.

In an example, the trench field effect transistor structure further includes a first insulating layer that is formed on the first gate 111 and is filled in the first trench 102 and a second insulating layer that is formed on the second gate and is filled in the second trench, and the source electrode structure 114 further extends onto upper surfaces of the first insulating layer 112 and the second insulating layer. Materials of the first insulating layer and the second insulating layer include, but are not limited to, silicon oxide.

The body region 107 is formed in the implantation region 104. The body region 107 abuts both the first trench 102 and the second trench 103. The body region 107 includes at least one body region lead-out region 110, and the body region lead-out region 110 abuts the junction around the body region 107. In an example, a doping type of the body region 107 is opposite to doping types of the epitaxial layer 101 and the semiconductor substrate 100. The body region 107 has the second doping type. In this example, the body region 107 is selected to be P-type lightly doped. In addition, a lower surface of the body region 107 is higher than the bottoms of the first trench 102 and the second trench 103. There is a height difference between the bottom of the body region 107 and the bottoms of the two types of trenches.

The source 109 is formed in the body region 107. The source 109 abuts the body region lead-out region 110, and an upper surface of the source 109 is flush with an upper surface of the body region lead-out region 110. In the present disclosure, the body region 107 is electrically led out based on the body region lead-out region 110, and an upper surface of the source 109 is flush with the upper surface of the body region 107, which can implement equal-potential electrical lead-out of the source 109 and the body region 107, and is conducive to preventing the device from a pre-mature breakdown. In the present disclosure, equal-potential lead-out is performed for the source 109 and the body region 107 without manufacturing contact holes, so that a cell dimension can continue to be reduced and a trench density of the device is further increased, thereby reducing an on-resistance, reducing device losses, and improving a switching response speed. In addition, as the cell dimension reduces, equal-potential lead-out is performed for the source 109 and the body region 107 without manufacturing contact holes, and the device can be prevented from a pre-mature breakdown, thereby obtaining stable electrical properties of the device.

In an example, the first trench 102 is perpendicular to the second trench 103, and the shape of the formed implantation region 104 includes a square, for example, may be selected to be square. Each body region 107 includes four body region lead-out regions 110 that may be selected to be square. Areas of the body region lead-out regions 110 are equal, and a spacing exists between adjacent body region lead-out regions 110. The body region lead-out regions 110 are respectively located in four corners of the implantation region 104 and are formed around the source 109. Preferably, the four body region lead-out regions 110 are symmetrically distributed in the body region 107, so that the source 109 with a symmetrical structure is obtained, which is conducive to improving electrical uniformity.

The source electrode structure 114 is in contact with both the upper surface of the source 109 and the upper surface of the body region lead-out region 110, to electrically lead out the source 109 and the body region 107. A material of the source electrode structure 114 may be aluminum but is not limited thereto.

As an example, the trench field effect transistor structure further includes a metal silicide layer on source 113. The metal silicide layer on source 113 is formed on at least the upper surface of the source 109 and the upper surface of the body region lead-out region 110. The source electrode structure 114 is formed on a surface of the metal silicide layer on source 113 to reduce a contact resistance. In an example, metal silicide may be Ti-silicide, but it is not limited thereto.

In an example, as shown in FIG. 12 and FIG. 13, the trench field effect transistor structure further includes a lead-out gate structure. A device region B and a termination region A are defined in the epitaxial layer 101. In an example, the first trench 102 and the second trench 103 are formed in the device region B, the lead-out gate structure is formed in the termination region A, and the lead-out gate structure includes: a lead-out gate trench 200, a lead-out gate dielectric layer 201 formed on an inner wall of the lead-out gate trench 200, a lead-out gate 202 formed on a surface of the lead-out gate dielectric layer 201, and a lead-out gate electrode structure 203 that is formed on the termination region and is electrically connected to the lead-out gate 202, where the lead-out gate electrode structure 203 is insulated from the source electrode structure 114. In another optional example, a metal silicide layer on lead-out gate 204 is further formed on the lead-out gate 202. The lead-out gate electrode structure 203 is formed on a surface of the metal silicide layer on lead-out gate 204 to reduce a contact resistance. In addition, the first gate 111 and the second gate may be led out to a gate pad by using a peripheral trench. In an example, the first gate 111 and the second gate are pulled out of the first trench and the second trench to an edge of a die, and a large trench is then used to string all trenches at the edge of the die into the gate pad. In an alternative example, the first gate and the second gate are electrically led out by using the lead-out gate structure in the termination region A.

Comparative Example

Figure 14:
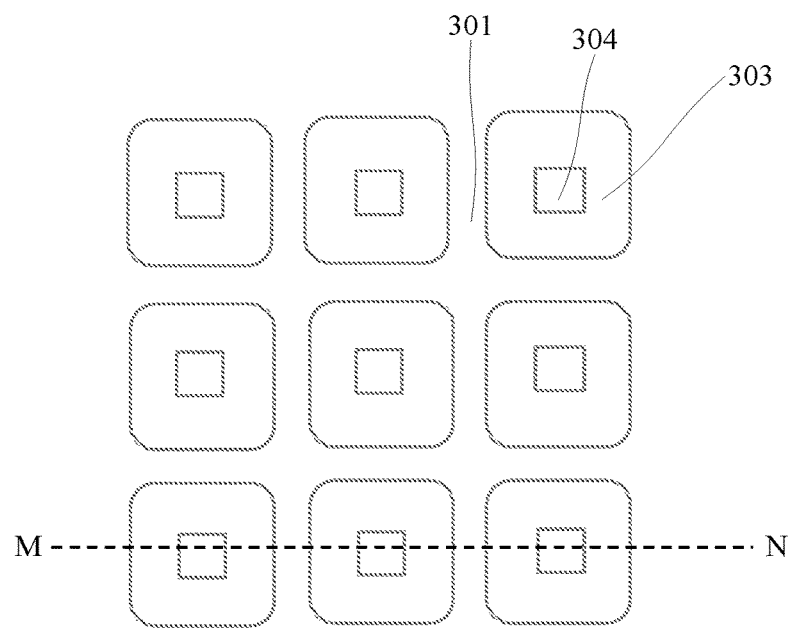
FIG. 14 is a top view of a trench field effect transistor in a comparative example of the present disclosure.
Figure 15:
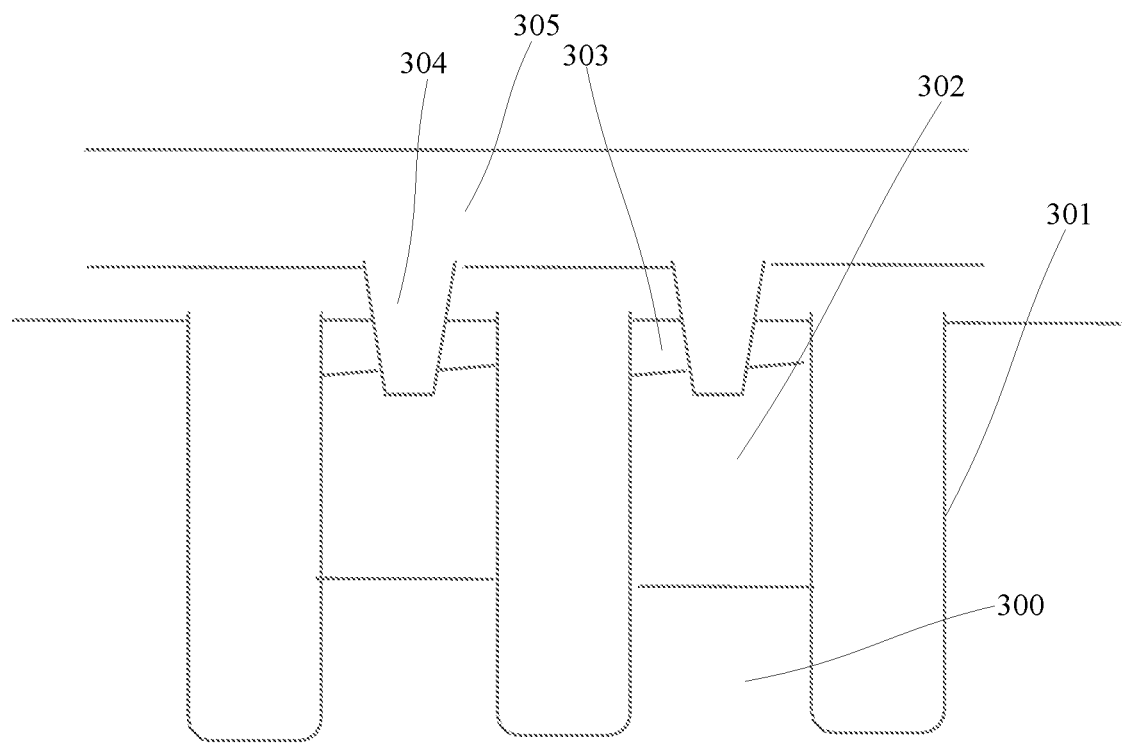
FIG. 15 is a schematic diagram of a cross-section along an M-N line in FIG. 14.

As shown in FIG. 14 and FIG. 15, the present disclosure further provides a comparative example. A trench field effect transistor provided by the comparative example includes a semiconductor substrate 300, an epitaxial layer 301, body regions 302, sources 303, source contact holes 304 and a source electrode structure 305. In the comparative example, the source 303 and the body region 302 are electrically led out based on the source contact hole 304. The source contact hole needs to be manufactured in the comparative example, which occupies a certain device space and is limited by a photolithography process. In addition, in a device structure in this comparative example, as a characteristic dimension (pitch size) is further reduced, a source region is reduced, the process difficulty of the source contact hole is increased, and O.L margin is a measure for aligning two over lay photo layers. When Ti/W fills the source contact hole to form the source electrode structure, the characteristic dimension (CD) of the device becomes smaller. As a result, a Ti process is limited, Ti cannot be sputtered uniformly into the contact hole, uniform silicide cannot be formed, and a better metal contact cannot be formed for Ti/W in the hole. In addition, floating is easy to occur in the body region, equal-potential lead-out cannot be formed for the source and the body region, and a pre-mature breakdown of the device occurs during a working process. However, based on the solutions of embodiment I and embodiment II in the present disclosure, the foregoing problems can be effectively resolved.

Based on the above, according to the trench field effect transistor structure and the manufacturing method for the same consistent with the present disclosure, self-aligned source implantation is implemented by designing a source implantation mask, and a body region lead-out region is formed while forming a source, so that the source and the body region are directly led out. The present disclosure uses a self-alignment technique to further reduce a cell dimension, and enables equal-potential electrical lead-out of the source and the body region without providing a source contact hole. For a closed-loop structure of a square trench field effect transistor, the present disclosure resolves problems of reduction of a cell dimension and lead-out of a body region by a process and a layout, thereby preventing a pre-mature device breakdown. Therefore, the present disclosure effectively overcomes various defects in the prior art, and has a high value in industrial use.

The foregoing embodiments merely exemplify the principles and effects of the present disclosure, but are not intended to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A trench field effect transistor structure, comprising:
a semiconductor substrate;
an epitaxial layer, formed on the semiconductor substrate, wherein a plurality of parallel first trenches arranged at intervals and a plurality of parallel second trenches arranged at intervals are formed in the epitaxial layer, the plurality of parallel first trenches and the plurality of parallel second trenches are arranged to intersect each other to form a plurality of junctions, and the adjacent first trenches of the plurality of parallel first trenches and second trenches of the plurality of parallel second trenches define a plurality of implantation regions;
a first gate dielectric layer and a second gate dielectric layer, respectively formed on an inner wall of the first trench and an inner wall of the second trench;
a first gate and a second gate, respectively formed on a surface of the first gate dielectric layer and a surface of the second gate dielectric layer, wherein the first gate is filled in the first trench, and the second gate is filled in the second trench;

a body region, formed in the plurality of implantation regions, wherein the body region abuts both the first trench and the second trench, the body region comprises at least one body region lead-out region, and the body region lead-out region abuts the junction around the body region;

a source, formed in the body region, wherein the source abuts the body region lead-out region, and an upper surface of the source is flush with an upper surface of the body region lead-out region, wherein the body region lead-out region is configured to implement equal-potential electrical lead-out of both the source and the body region; and a source electrode structure, wherein the source electrode structure is in contact with both the upper surface of the source and the upper surface of the body region lead-out region, to electrically lead out the source and the body region; wherein the trench field effect transistor structure is free from contact holes.

2. The trench field effect transistor structure as in claim 1, further comprising a first insulating layer that is formed on the first gate and is filled in the first trench and a second insulating layer that is formed on the second gate and is filled in the second trench, wherein the source electrode structure further extends onto upper surfaces of the first insulating layer and the second insulating layer.

3. The trench field effect transistor structure as in claim 1, further comprising a metal silicide layer on source, wherein the metal silicide layer on source is formed on at least the upper surface of the source and the upper surface of the body region, and the source electrode structure is formed on a surface of the metal silicide layer on source.

4. The trench field effect transistor structure as in claim 1, wherein the first trench is perpendicular to the second trench, a shape of one of the plurality of the implantation regions comprises a rectangle, each body region comprises four body region lead-out regions, areas of the body region lead-out regions are equal, and a spacing exists between adjacent body region lead-out regions.

5. The trench field effect transistor structure as in claim 1, further comprising a lead-out gate structure, wherein a device region and a termination region are defined in the epitaxial layer, the first trench and the second trench are formed in the device region, and the lead-out gate structure is formed in the termination region and comprises: a lead-out gate trench, a lead-out gate dielectric layer formed on an inner wall of the lead-out gate trench, a lead-out gate formed on a surface of the lead-out gate dielectric layer, and a lead-out gate electrode structure that is formed on the termination region and is electrically connected to the lead-out gate, wherein the lead-out gate electrode structure is insulated from the source electrode structure.

* * * * *